United States Patent
Kaufmann et al.

(10) Patent No.: US 9,689,931 B2
(45) Date of Patent: Jun. 27, 2017

(54) MAGNETIC FIELD SENSOR AND METHOD FOR DETERMINING AND CORRECTING AN OFFSET VOLTAGE OF A MAGNETIC FIELD SENSOR

(75) Inventors: Timo Kaufmann, Freiburg (DE); Patrick Ruther, Karlsruhe (DE); Roiy Raz, Freiburg (DE); Oliver Paul, Au (DE)

(73) Assignees: TDK-Micronas GmbH, Freiburg (DE); Albert-Ludwigs-Universitaet Freiburg, Freiburg (DE)

(*) Notice: Subject to any disclaimer, the term of this patent is extended or adjusted under 35 U.S.C. 154(b) by 948 days.

(21) Appl. No.: 13/542,489

(22) Filed: Jul. 5, 2012

(65) Prior Publication Data
US 2013/0015847 A1 Jan. 17, 2013

Related U.S. Application Data

(60) Provisional application No. 61/507,890, filed on Jul. 14, 2011.

(30) Foreign Application Priority Data

Jul. 14, 2011 (DE) .................. 10 2011 107 711

(51) Int. Cl.
*G01R 33/07* (2006.01)
*G01R 33/00* (2006.01)
(Continued)

(52) U.S. Cl.
CPC ......... *G01R 33/0029* (2013.01); *G01R 33/02* (2013.01); *G01R 33/022* (2013.01); *G01R 33/077* (2013.01)

(58) Field of Classification Search
CPC .. G01R 33/06; G01R 33/0029; G01R 33/075; G01R 33/07; G01R 33/022; G01R 33/02; G01R 33/077
(Continued)

(56) References Cited

U.S. PATENT DOCUMENTS 6,476,602 B1  11/2002  Gray
6,768,301 B1* 7/2004  Hohe .................. G01R 33/0094
                                            324/225
(Continued)

FOREIGN PATENT DOCUMENTS

BG        65935 B1    5/2010
DE    101 50 955 C1   6/2003
(Continued)

OTHER PUBLICATIONS

Kejik et al., Circular Hall Transducer for Angular Position Sensing; Transducers & Eurosensors ,07, 14th Conf. Solid-State Sensors, Actuators and Microsystems, 2007, pp. 2593-2596.
(Continued)

*Primary Examiner* — Son Le
*Assistant Examiner* — Brent J Andrews
(74) *Attorney, Agent, or Firm* — Muncy, Geissler, Olds & Lowe, P.C.

(57) ABSTRACT

A magnetic field sensor having a Hall sensor with a first terminal contact and with a second terminal contact and with a third terminal contact and with a fourth terminal contact and with a fifth terminal contact, whereby a first switch with a control input is provided between the first terminal contact and the fifth terminal contact, and the first switch connects or disconnects the first terminal contact to/from the fifth terminal contact, and a control unit is provided and the control unit is connected to the control input of the first switch.

16 Claims, 2 Drawing Sheets

(51) Int. Cl.
*G01R 33/02* (2006.01)
*G01R 33/022* (2006.01)

(58) Field of Classification Search
USPC .................................................. 324/225, 251
See application file for complete search history.

(56) References Cited

U.S. PATENT DOCUMENTS

| | | | |
|---|---|---|---|
| 2004/0207031 A1* | 10/2004 | Berndt | H01L 43/065 257/414 |
| 2007/0029999 A1* | 2/2007 | Middelhoek et al. | 324/251 |
| 2007/0290682 A1* | 12/2007 | Oohira | G01R 33/07 324/251 |
| 2008/0265880 A1* | 10/2008 | Nishikawa | 324/251 |
| 2010/0123458 A1* | 5/2010 | Schott | 324/251 |
| 2010/0133632 A1* | 6/2010 | Schott | G01R 33/07 257/427 |
| 2010/0164491 A1* | 7/2010 | Kejik | G01R 33/077 324/251 |

FOREIGN PATENT DOCUMENTS

| | | |
|---|---|---|
| JP | 60-154582 A | 8/1985 |
| WO | WO 03/036733 A2 | 5/2003 |

OTHER PUBLICATIONS

Chinese Search Report for Chinese Application No. 201210241622.4 English translation.

* cited by examiner

MAGNETIC FIELD SENSOR AND METHOD FOR DETERMINING AND CORRECTING AN OFFSET VOLTAGE OF A MAGNETIC FIELD SENSOR

This nonprovisional application claims priority to German Patent Application No. DE 10 2011 107 711.5, which was filed in Germany on Jul. 14, 2011, and to U.S. Provisional Application No. 61/507,890, which was filed on Jul. 14, 2011, and which are both herein incorporated by reference.

BACKGROUND OF THE INVENTION

Field of the Invention

The invention relates to a magnetic field sensor and a method for determining and correcting an offset voltage of a magnetic field sensor.

Description of the Background Art

DE 10 150 955 C1 discloses a magnetic field sensor. The magnetic field sensor has a plurality of Hall sensors each with five terminal contacts. In this case, the up to four Hall sensors are designed parallel to one another and the terminal contacts are connected to one another by means of cyclic commutation. Further, other Hall sensors are known from U.S. Pat. Appl. No. 2010/0123458 A1 and "Kejik, P., Reymond, S., Popovic, R. S.: Circular Hall Transducer for Angular Position Sensing. In: Transducers & Eurosensors, 07, 14th Conf. Solid-State Sensors, Actuators and Microsystems, 2007, pp. 2593-2596." In this regard, a circular arrangement with a plurality of Hall sensors with individual Hall contacts is disclosed in the latter publication. In each case, five contacts are selected from a plurality of Hall sensor contacts by means of a control unit to produce a virtual five-contact Hall sensor. Other Hall contacts on the circular arrangement can be selected by the control one after another in a time sequence, so that the virtually formed Hall sensor more or less rotates in the circle.

SUMMARY OF THE INVENTION

It is therefore an object of the invention to provide a device that refines the conventional art.

According to an embodiment of the invention, a magnetic field sensor is provided, having a Hall sensor with a first terminal contact and with a second terminal contact and with a third terminal contact and with a fourth terminal contact and with a fifth terminal contact, whereby a first switch with a control input is provided between the first terminal contact and the fifth terminal contact, and the first switch connects or disconnects the first terminal contact to/from the fifth terminal contact, and a control unit is provided and the control unit is connected to the control input of the first switch. It should be noted that the magnetic field sensor can be a electrically insulated Hall sensor, which is formed as a single separate Hall sensor. Such a Hall sensor can be formed as a semiconductor device in an electrically insulated well and has in particular no other terminal contacts apart from the indicated terminal contacts.

According to another embodiment of the invention, a method for determining and correcting an offset voltage of a magnetic field sensor is provided, having a vertical Hall sensor with a first terminal contact and with a second terminal contact and with a third terminal contact and with a fourth terminal contact and with a fifth terminal contact, whereby a control unit and a first switch with a control input is provided between the first terminal contact and the fifth terminal contact, and in a first state the control input of the first switch is controlled by means of the control unit, and the offset voltage of the Hall sensor is determined, whereby the first terminal contact is disconnected from the fifth terminal contact by means of the first switch, and in a second state, the first terminal contact is connected to the fifth terminal contact by means of the first switch, and a Hall voltage supplied with the offset voltage is measured and the measured Hall voltage is corrected by the offset voltage.

An advantage of the device and method of the invention is that a Hall voltage, reduced by an offset voltage, can be determined by the connection according to the invention and by means of the consideration of the resistances between the individual contacts. As a result, the signal-to-offset ratio of the magnetic field sensor or of the Hall sensor is increased; i.e., the Hall voltage can be determined very largely without offset. It is especially advantageous that the determination of the offset voltage can be performed both in the presence and absence of a magnetic field. As a result, the method of the invention for determining the strength of a magnetic field can be used advantageously. It is advantageous further that the method and the device can also be used within a large temperature range, preferably between −40° C. and 170° C.

In an embodiment, all terminal contacts are arranged in a row, whereby the first terminal contact of the Hall sensor is formed as the initial contact and the fifth terminal contact as the end contact of the row. According to another embodiment, the first terminal contact and the fifth terminal contact in each case form outer terminal contacts, so that the other terminal contacts are formed between the first terminal contact and the fifth terminal contact.

In an embodiment, the first switch includes a second switch and a third switch, and the second switch and the third switch are connected in series to one another and the second switch with a control input is connected to the control unit and the third switch with a control input to the control unit.

In another embodiment, the first terminal contact and the second terminal contact and the third terminal contact and the fourth terminal contact and the fifth terminal contact are connectable to the control unit. An advantage is that by means of the control unit the terminal contacts can be connected to a voltage source or a current source and as a result controlled differently.

In another embodiment, the control unit can be configured to determine the offset voltage in a first state by means of the first switch or to disconnect the first terminal contact from the fifth terminal contact by means of the second switch and the third switch, and in a second state for measuring a Hall voltage supplied with the offset voltage to connect the first terminal contact to the fifth terminal contact by means of the switch. In particular, the resistances in each case between two adjacent terminal contacts are determined in the first state. Preferably, the terminal contacts are supplied with different voltage levels for determining the resistances between the terminal contacts. The offset voltage superposed on the Hall voltage is determined by means of the measured resistance values based on an equivalent circuit.

According to another embodiment, four Hall voltages corrected for the respective offset voltage are determined by means of a switching method, i.e., "switching-current" method, and an average Hall voltage is determined from the four Hall voltages. Tests have shown that a Hall sensor with a total of five contacts can be operated in four different modes, whereby in a first mode and second mode the first terminal contact and the fifth terminal contact are supplied with a first reference voltage and simultaneously the third terminal contact is supplied with a second reference voltage. In so doing, the Hall voltage is tapped at the second terminal contact and at the fourth terminal contact. Accordingly, in a third mode and a fourth mode, the Hall voltage is tapped at the first terminal contact, at the fifth terminal contact, and at the third terminal contact. To this end, the second terminal contact is supplied with a first reference voltage and the fourth terminal contact is supplied with a second reference voltage.

Measurements in the first state and then measurements in the second state can be performed in each mode. After this, a Hall voltage corrected for the determined offset voltage is calculated for each mode. Next, the Hall voltages of the four modes are added with consideration of the signs. It is understood that alternatively an arithmetic mean can also be calculated from the values of the four Hall voltages.

In an embodiment, the first terminal contact up to and including the fifth terminal contact are arranged on a straight line. It is preferred further to design the Hall sensor as a vertical Hall sensor.

According to another embodiment, the Hall sensor has a well region with a first conductivity type, whereby the well region comprises all terminal contacts and a predetermined distance is formed between two adjacent terminal contacts. Preferably, the distances between the terminal contacts are substantially the same. It is advantageous that the well region also has the predetermined distance between the well boundary and the first terminal contact and between the well boundary and the fifth terminal contact. It should be noted that in an alternative embodiment it is sufficient for the distance between the second terminal contact and the third terminal contact to be substantially the same as the distance between the third terminal contact and the fourth terminal contact. In this respect, the distance between the first terminal contact and the second terminal contact is substantially equal to the distance between the fourth terminal contact and the fifth terminal contact. In the resulting present embodiment, the distance to the well boundary is preferably to be selected at least as great as the smallest of the respective distances of the contacts to one another.

In an embodiment, the Hall sensor is arranged together with an integrated circuit in a single semiconductor body. As a result, the Hall sensor can be formed as part of the integrated circuit and be monolithically integrated with a control circuit and evaluation circuit in a functional connection. It should be noted that the term functional connection is also understood, inter alia, to be an electrical connection between the integrated circuit and the magnetic field sensor. It is preferred further to arrange the Hall sensor and the integrated circuit in a single common housing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Similar parts are labeled with identical designations. The illustrated embodiments are highly schematized; i.e., the distances and lateral and vertical extensions are not to scale and, if not otherwise indicated, also do not have any derivable geometric relation relative to one another.

Figure 1:
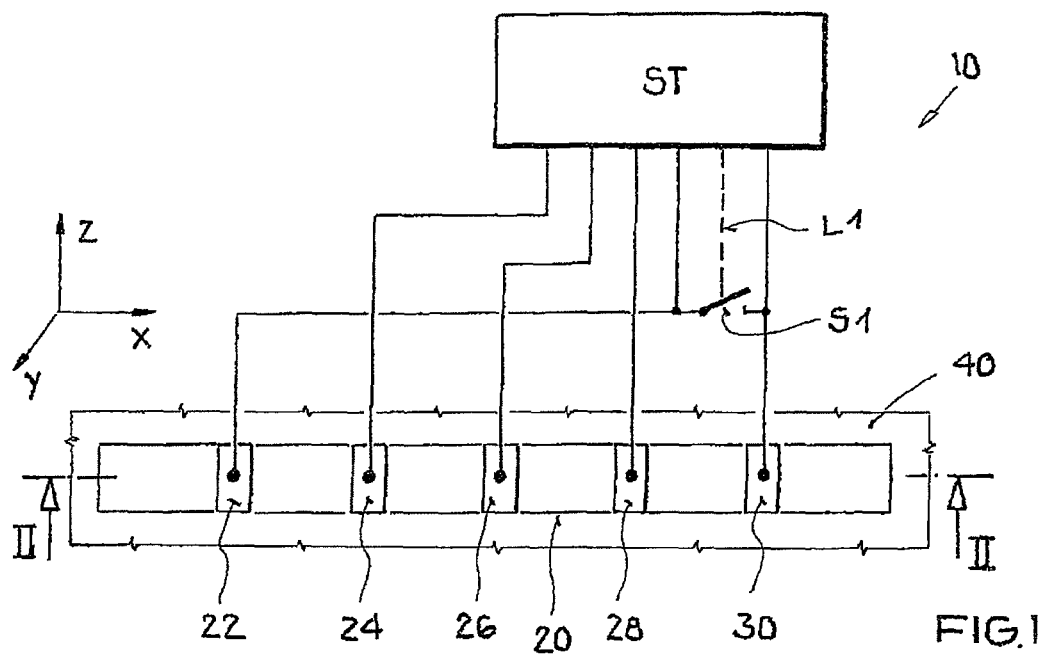
FIG. 1 shows a schematic plan view of an embodiment of the invention of a magnetic field sensor.

The illustration in FIG. 1 shows an embodiment of a magnetic field sensor 10 of the invention, having a preferably vertically designed Hall sensor 20, with a first terminal contact 22, a second terminal contact 24, a third terminal contact 26, a fourth terminal contact 28, and a fifth terminal contact 30, whereby all terminal contacts are connected to a control unit ST. In this respect, first terminal contact 22 up to and including fifth terminal contact 30 are preferably arranged on a straight line. A first switch S1 is interconnected between first terminal contact 22 and fifth terminal contact 30. The first switch S1 has a control input, which is connected with a line L1 to control unit ST.

The connection between first terminal contact 22 and fifth terminal contact 30 is broken by means of control unit ST in a first state and closed in a second state. It should be noted that terminal contacts 22 to 30 of vertical Hall sensor 20 are formed in the drawn x-z plane to the surface of a semiconductor body. The magnetic field lines B to be measured point in a positive or negative z-direction. The voltages or currents are measured at selected terminal contacts by means of control unit ST, whereas other selected terminal contacts are supplied with a voltage. Overall, four different terminal assignments can be formed in each case by a permutation by means of control unit ST in the first state and also in the second state. As a result, a Hall voltage corrected for an offset in each case can be determined in the four different modes.

Figure 2:
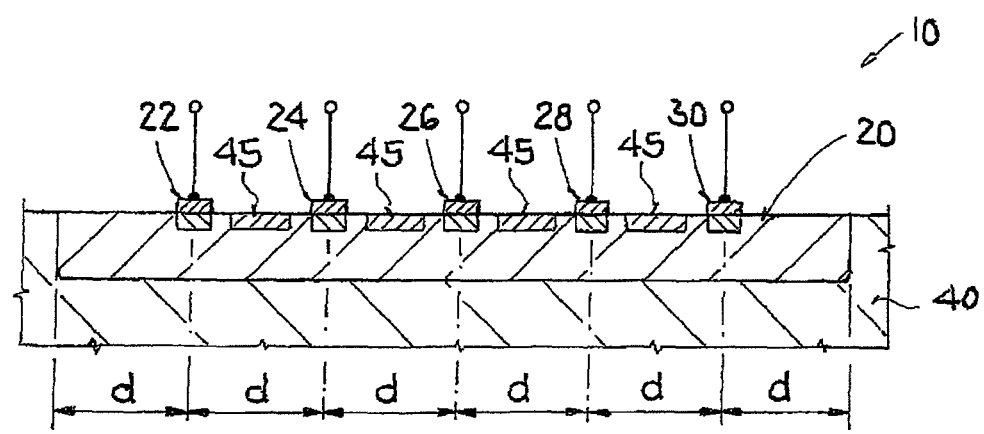
FIG. 2 shows a schematic cross section along a line II of the embodiment of FIG. 1.

A cross section along a line II of the embodiment of the invention in FIG. 1 is shown in FIG. 2. Only the differences relative to the embodiment shown in FIG. 1 will be described below. Immediately below first terminal contact 22 up to and including fifth terminal contact 30, a heavily doped n-contact region is formed in each case, to connect the individual terminal contacts 22 to 30 in a low-impedance manner to a slightly doped n-well region 40. n-Well region 40 is formed in the semiconductor body. An isolation region 45, having an oxide or a p+ diffusion, is formed in each case between the individual n-contact regions. The semiconductor body is preferably formed as a p-substrate. Preferably, n-well region 40 has a phosphorus doping, whereas the n-contact regions preferably have an arsenic doping, whereby the concentration of the doping of the contact regions is higher than the doping of the wells. By contrast, the p-substrate has a boron doping. Terminal contacts 22 to 30 are each separated from one another by a distance d. Further, a distance d is also formed in each case between first terminal contact 22 and the boundary of n-well region 40 and between the fifth terminal contact and the boundary of n-well region 40. According to the shown embodiment, the direction of the magnetic field to be measured points in the positive or negative z-direction, i.e., out of or into the plane of the drawing.

Figure 3:
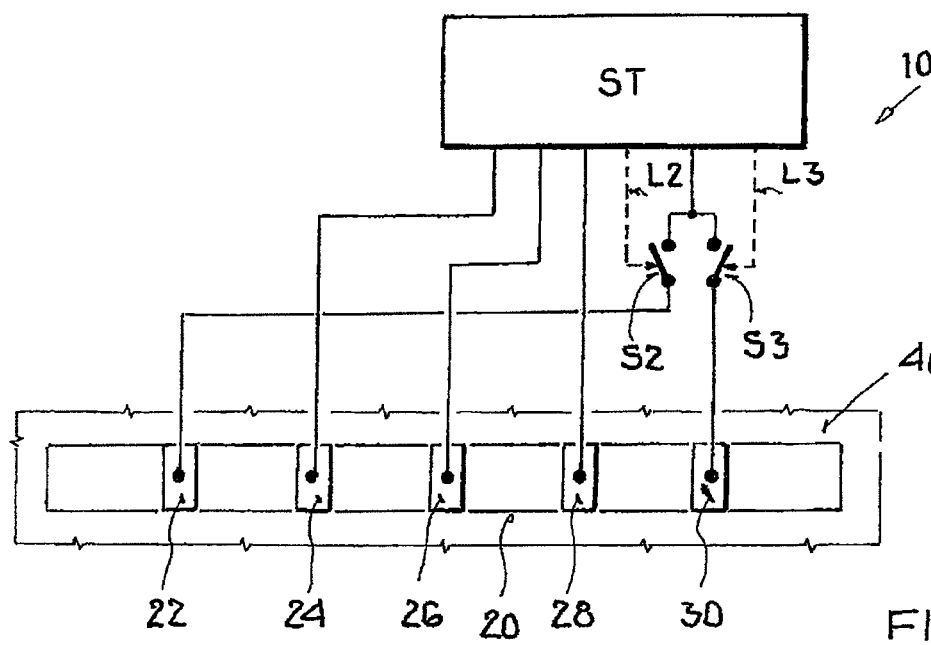
FIG. 3 shows a schematic plan view of another embodiment of a magnetic field sensor.

A schematic plan view of another embodiment of a magnetic field sensor is shown in FIG. 3. Only the differences relative to the embodiment shown in FIG. 1 will be explained below. Accordingly, first switch S1 is now replaced by a second switch S2 and a third switch S3, whereby second switch S2 and third switch S3 are connected in series to one another and second switch S2 is connected with a second line L2 with a control input to control unit ST and third switch S3 with a third line L3 with a control input to control unit ST. In the measurements in the first state, either the second switch is closed or the third switch is closed by the control unit and as a result either first terminal contact 22 or fifth terminal contact 30 is connected to the control unit. An advantage of this realization is that in the second state, in which second switch S2 and the switch S3 are closed, the switch resistances of second switch S2 and of third switch S3 in the particular line to first terminal contact 22 and to fifth terminal contact 30 are formed symmetrically.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic field sensor comprising:
   a Hall sensor having a first terminal contact, a second terminal contact, a third terminal contact, a fourth terminal contact, and a fifth terminal contact;
   a first switch with a control input arranged between the first terminal contact and the fifth terminal contact, the first switch being configured to connect or disconnect the first terminal contact to or from the fifth terminal contact; and
   a control unit connected to the control input of the first switch,
   wherein the control unit is connected to the first switch via the control input and controls the first switch,
   wherein the first terminal contact and the fifth terminal contact are connected to the control unit and are connected to each other via the first switch,
   wherein the second terminal contact, the third terminal contact, and the fourth terminal contact are directly connected to the control unit.

2. The magnetic field sensor according to claim 1, wherein the first switch has a second switch and a third switch, the second switch and the third switch being connected in series to one another and the second switch with the control input is connected to the control unit and the third switch is connected with the control input to the control unit.

3. A magnetic field sensor comprising:
   a Hall sensor having a first terminal contact, a second terminal contact, a third terminal contact, a fourth terminal contact, and a fifth terminal contact;
   a first switch with a control input arranged between the first terminal contact and the fifth terminal contact, the first switch being configured to connect or disconnect the first terminal contact to or from the fifth terminal contact; and
   a control unit connected to the control input of the first switch,
   wherein the control unit is configured to determine an offset voltage in a first state via the first switch or to disconnect the first terminal contact from the fifth terminal contact via the second switch and the third switch, and in a second state for measuring a Hall voltage supplied with the offset voltage to connect the first terminal contact to the fifth terminal contact via the switch.

4. The magnetic field sensor according to claim 1, the first terminal contact, the second terminal contact, the third terminal contact, the fourth terminal contact, and the fifth terminal contact are arranged on a straight line.

5. The magnetic field sensor according to claim 1, wherein the Hall sensor is a vertical Hall sensor.

6. The magnetic field sensor according to claim 1, wherein the Hall sensor has a well region with a first conductivity type, wherein the well region comprises all terminal contacts, wherein a distance is formed between two adjacent terminal contacts and the well region has the distance between the well boundary and the first terminal contact and between the well boundary and the fifth terminal contact.

7. The magnetic field sensor according to claim 1, wherein all terminal contacts are arranged in a row.

8. The magnetic field sensor according to claim 1, wherein the first terminal contact and the fifth terminal contact in each case form outer terminal contacts so that the other terminal contacts are formed between the first terminal contact and the fifth terminal contact.

9. The magnetic field sensor according to claim 1, wherein the Hall sensor is arranged in a semiconductor body and an integrated circuit is formed on the semiconductor body.

10. The magnetic field sensor according to claim 9, wherein the Hall sensor and the integrated circuit are connected electrically and are arranged in a single common housing.

11. A method for determining and correcting an offset voltage of a magnetic field sensor, the method comprising:
   providing a vertical Hall sensor with a first terminal contact, a second terminal contact, a third terminal contact, a fourth terminal contact, and a fifth terminal contact;
   providing a control unit and a first switch with a control input between the first terminal contact and the fifth terminal contact,
   controlling, in a first state, the control input of the first switch via the control unit;
   determining the offset voltage of the Hall sensor;
   disconnecting the first terminal contact from the fifth terminal contact via the first switch;
   connecting, in a second state, the first terminal contact to the fifth terminal contact via the first switch;
   measuring a Hall voltage supplied with the offset voltage; and
   correcting the measured Hall voltage by the offset voltage.

12. The method according to claim 11, wherein a resistances in each case between two adjacent terminal contacts are determined in the first state, and wherein, for determining the resistances, the terminal contacts are supplied with different voltage levels.

13. The method according to claim 12, wherein the offset voltage superposed on the Hall voltage is determined from the determined resistance values.

14. The method according to claim 13, wherein four Hall voltages corrected for the respective offset voltage are determined via a switching method and an average Hall voltage is determined from the four Hall voltages.

15. The magnetic field sensor according to claim 1, wherein the hall sensor is an electrically insulated Hall sensor, which is formed as a single separate Hall sensor in an electrically insulated well.

16. The magnetic field sensor according to claim 1, wherein the first terminal contact, the second terminal contact, the third terminal contact, the fourth terminal contact, and the fifth terminal contact are arranged in a row, and wherein the first terminal contact of the Hall sensor is formed as an initial contact and the fifth terminal contact as an end contact of the row.

\* \* \* \* \*